United States Patent [19]

Ohori

[11] Patent Number: 5,782,362
[45] Date of Patent: Jul. 21, 1998

[54] WAFER CASSETTE IN WAFER CARRIER

[75] Inventor: Shinichi Ohori, Niigata-ken, Japan

[73] Assignees: Shin-Etsu Polymer Co., Ltd.; Shin-Etsu Handotai Co., Ltd., both of Tokyo, Japan

[21] Appl. No.: 729,978

[22] Filed: Oct. 11, 1996

[30] Foreign Application Priority Data

Oct. 12, 1995 [JP] Japan .................. 7-289158

[51] Int. Cl.⁶ .................................. B65D 85/46
[52] U.S. Cl. .................. 206/711; 206/454; 211/41
[58] Field of Search ................... 206/454, 449, 206/710, 711, 722, 822, 823; 211/41

[56] References Cited

U.S. PATENT DOCUMENTS

| | | | |
|---|---|---|---|
| 4,518,085 | 5/1985 | Chisholm et al. | 206/454 |
| 4,588,086 | 5/1986 | Coe | 206/711 |
| 4,762,689 | 8/1988 | Frey et al. | 206/454 |
| 5,207,324 | 5/1993 | Kos | 206/454 |
| 5,273,159 | 12/1993 | Gregerson | 206/454 |
| 5,472,099 | 12/1995 | Terashima | 206/454 |
| 5,575,394 | 11/1996 | Nyseth | 206/454 |

*Primary Examiner*—Paul T. Sewell
*Assistant Examiner*—Nhan T. Lam
*Attorney, Agent, or Firm*—Wenderoth, Lind & Ponack, L.L.P.

[57] ABSTRACT

A wafer cassette of a wafer carrier holds a plurality of wafer materials such as semiconductor single crystal silicon wafers. The wafer cassette is contained in a box body having a covering for transportation and storage of the silicon wafers with safety from contamination and mechanical damage. The wafer cassette is a casing have an opening in the upper and lower surfaces and having a pair of opposite side walls each of which is provided on the inner surface thereof with a plurality of alignment grooves for receiving wafer materials in parallel with each other. The wafer cassette is provided with wafer presser plates each covering the upper or lower surface in a freely demountable fashion each of which having a pair of engageable parts on two opposite sides thereof. A plurality of elastic plates are provided at the center of the plates, between the pair of the engageable parts, in alignment in the direction of the wafer materials held on the cassette. A protrusion extends from each of the elastic plates and the surface of the protrusions are engraved to form a groove having a V-shaped cross section to receive a wafer material.

20 Claims, 8 Drawing Sheets

WAFER CASSETTE IN WAFER CARRIER

BACKGROUND OF THE INVENTION

The present invention relates to a wafer cassette which holds a plurality of semiconductor single crystal silicon wafers, referred to simply as wafers hereinafter, and which is contained in a wafer carrier box for preventing the wafers from mechanical damage and contamination during storage and transportation.

The wafer cassette 1 of a wafer carrier in the prior art is formed, as illustrated in FIGS. 12 to 14, in the form of a case having an opening in the front surface and openings in the center of the upper and lower surfaces respectively. Curved pleats are formed in lower parts of side walls of the cassette. The curved pleats are connected by an integrally molded connecting bar 3 in the front surface of the cassette. The curved pleats serve as receptacles for the wafers 2. A plurality of V-shaped alignment grooves 4 are formed in parallel on the inward surfaces of both side walls. Each of the alignment grooves 4 on one of the side walls is located opposite to one of the grooves 4 on the other side wall.

When a large number of wafers 2 are to be contained in a wafer carrier, the wafers 2 are inserted into the wafer cassette one by one in parallel to each other and the wafer cassette holding the wafers 2 is put into the container body 15 of the wafer carrier. A frame-formed sealing member 16, such as a gasket or packing is then mounted on the upper open periphery of the container body 15. The covering 17 of the wafer carrier, having a wafer presser 18 on the lower surface thereof, is pressed down onto the upper opening of the body 15 thus to complete the packaging of the wafers 2 in the wafer carrier. The wafer presser 18 is in the form of a generally rectangular frame having a large number of elastic comb teeth members 19 extending from the lower surface of each of the two opposite sides of the rectangular frame. The elastic comb teeth members 19 are formed in an L-shaped bent configuration. Each of these comb teeth-like elastic members 19 comes into contact with the upper periphery of each of the wafers 2 with elastic resilience so as to secure the wafers 2 at the respective proper positions. The wafer carrier holding a plurality of wafers 2 in this state is transported from the manufacturer of the wafers to the user thereof where the wafer carrier is unpackaged and the wafers 2. either standing upright as is illustrated in FIG. 12 or lying horizontally by turning the wafer carrier, are taken out one by one by an automatic robot machine (not shown in the figure) or manually by workers.

In the above described wafer cassette 1 of a wafer carrier in the prior art, the wafer presser 18 is fixedly mounted on the lower surface of the covering 17 so that the relative positioning of the wafer presser 18 and the wafers 2 is heavily influenced by the relative position of the wafer cassette 1, container body 15 and covering 17. Accordingly, when the relative position of the wafer cassette 1, container body 15 and covering 17 is improper with a play, there is a problem in that the comb teeth-like elastic members 19 of the wafer presser 18 do not come into orderly contact with the upper peripheries of the wafers 2. Rather, the upper periphery of a wafer sometimes falls into the gap of two adjacent elastic members 19 so that the wafers 2 cannot be effectively and appropriately protected. Further, the width of the wafer alignment grooves 4 of the wafer cassette is somewhat larger than the thickness of the wafers 2, for facilitating the loading and unloading of the wafers 2 with respect to the wafer cassette 1. When the wafer cassette 1, holding the wafers 2, is kept standing upright, each of the wafers 2 cannot stand just upright but is tilted, though slightly, within the limit by the clearance in the alignment grooves 4. This tilting sometimes results in contact between the peripheries of two adjacent wafers 2 causing damage during transportation and handling of the wafer carrier (see FIG. 13, lower center part). When the wafer cassette 1 is oriented such that the wafers 2 are held horizontally, as is illustrated in FIG. 14, another problem arises in that one of the flat surfaces of each of the wafers 2 is always in contact with and rubbed by the wall surface of the alignment groove 4. This contact leads to the generation of abrasion dust particles which deposit on the surface of the wafers causing contamination or forming scratches on the wafer surfaces.

SUMMARY OF THE INVENTION

The present invention, which has been completed in view of the above described problems and disadvantages in the prior art, accordingly provides a novel and improved wafer cassette in a wafer carrier in which the wafers held therein can be prevented from being displaced from the proper positions thus eliminating contact between adjacent wafers and any resulting contamination of the wafer surfaces caused by the deposition of dust particles and formation of scratches.

Thus, the wafer cassette of the invention is a casing having an opening in each of the upper and lower surfaces and having a pair of opposite side walls each provided on the inner surface thereof with a plurality of alignment grooves for receiving wafer materials in parallel with each other. The cassette is provided with wafer presser plates, each of which covers either the upper or lower surface of the cassette. Each presser plate is freely demountable and has a pair of engageable parts on two opposite sides thereof. A plurality of elastic plates are provided at the center, between the pair of the engageable parts, in alignment in the direction of the wafer materials held by the cassette. A protrusion extends from each of the elastic plates. The surface of each of the protrusions is engraved to form a groove having a V-shaped cross section to receive a wafer material.

As a preferable embodiment, engagement ribs protrude outwardly from the upper and lower ends of the opposite walls of the wafer cassette and a pair of positioning stoppers are formed at the end of each of the engagement ribs. The width between the paired positioning stoppers is substantially equal to the width of the wafer presser plate thus causing the center line of the alignment groove to be in coincidence with the center line of the V-shaped wafer-receiving groove.

DETAILED DESCRIPTION OF THE PREFERRED EMBODIMENTS

According to the invention, wafer presser plates are mounted on the upper and lower open surfaces of the wafer cassette, by which silicon wafers are directly positioned inside of the wafer cassette without the risk of displacement. This mounting of the presser plates to the wafer cassette ensures that the positioning of each of the wafers is free from the influence of the relative position of the wafer cassette, container body of the wafer carrier and covering. In addition, the upper and lower peripheries of the wafer are in contact with center lines of respective grooves in the upper and lower wafer presser plates so that each of the wafers is kept apart from the alignment groove of the cassette, thus preventing contamination of the wafer surface, formation of scratches on the wafer surface and other troubles. Further, the elastic resilience of the elastic plate serves to ensure correct positioning of the wafers because, when the upper or lower periphery of the wafer gets derailed, the elastic plate is bent archwise to effect movement of the periphery of the wafer into the center line of the V-shaped groove. The elastic resilience of the elastic plate exhibits a damping effect to the vibrations and mechanical shocks on the wafer materials during transportation of the wafer carrier so that the wafers contained therein can be prevented from damage.

According to the preferable embodiment of the invention, the widths of a pair of the positioning stoppers and the wafer presser plates act to effect relative positioning of the presser plates and the positioning stoppers during mounting of the wafer presser plates to the openings of the wafer cassettes. This relative positioning causes the center line of the alignment groove of the wafer cassette and the center line of the V-shaped groove of the protrusion on the presser plate to be brought into coincidence by merely mounting the wafer presser plate between a pair of the positioning stoppers.

In the following, particular embodiments of the wafer cassette of the present invention are described in detail by making reference to the accompanying drawings.

Figure 1:
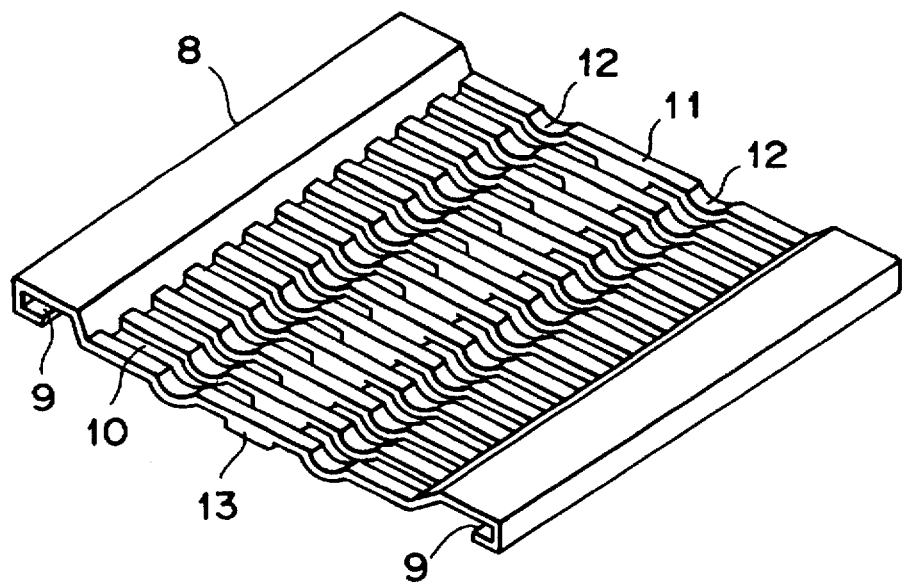
FIG. 1 is a perspective view of the upper wafer presser plate of the inventive wafer cassette of a wafer carrier.
Figure 2:
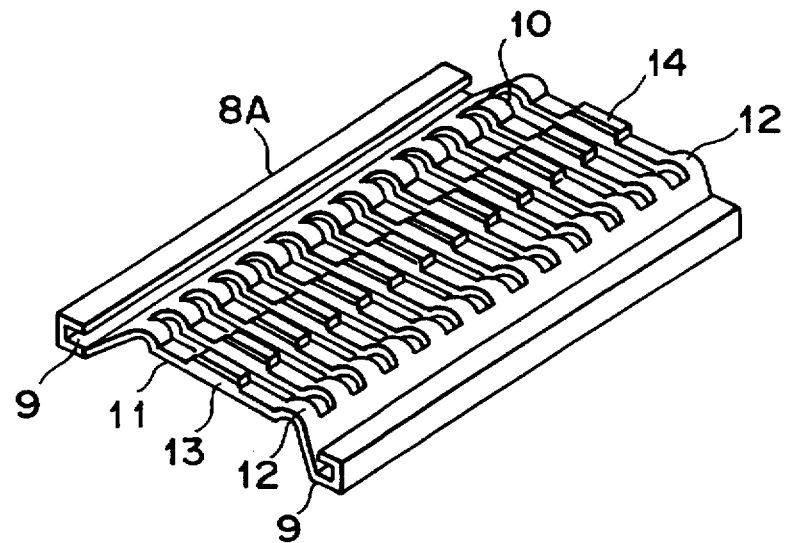
FIG. 2 is a perspective view of the lower wafer presser plate of the inventive wafer cassette of a wafer carrier.

The wafer cassette 1 of the invention has a structure in which an upper wafer presser plate 8, illustrated in FIG. 1, and a lower wafer presser plate 8A, illustrated in FIG. 2, are mounted on the upper opening and lower opening, respectively, of the cassette in a freely demountable fashion. These wafer presser plates 8, and 8A serve for the positioning of silicon wafers in their respective proper positions.

As is illustrated in FIGS. 6 to 8 and 11, the wafer cassette 1 of the invention is shaped generally in the form of a case having an opening in the front surface and openings in the center areas of the upper and lower surfaces respectively. Each of the side walls is curved inwardly on the lower part thereof so as to be adaptable to the circumference of the wafers to be held therein. The two side walls are connected by an integrally molded connecting bar 3 bridging along the middle height of the front open surface to facilitate insertion and removal of wafer 2 with respect to the cassette 1. A plurality of recessed alignment grooves 4 are provided on the inner surface of each of the side walls and each has a V-shaped cross section. The alignment grooves are arranged in the back-to-front direction, i.e. right-to-left direction in FIG. 6, in such a fashion that one of the alignment grooves 4 on one of the side walls oppositely face only one of the alignment grooves 4 on the other side wall. A protruded fitting rib or fitting protrusion 5 is formed on each of the four corners of the cassette. These fitting ribs 5 come into engagement with the respective fitting holes in the covering (not shown in the figures) when the covering is mounted on the container body of the wafer carrier. Engagement ribs 6 extend in the horizontal directions from the upper and lower ends of each of the side walls and a pair of positioning stoppers 7 protrude with a distance on the peripheral edges of the inclined front and back surfaces of each of the engagement ribs 6. The silicon wafer 2 to be held on the inventive wafer cassette is in the form of a generally circular thin disk which optionally has a so-called "orientation flat" as is the case in the wafers 2 illustrated in FIG. 12.

Figure 3:
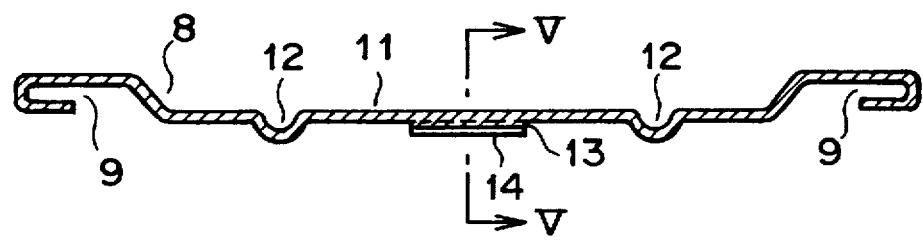
FIG. 3 is a vertical cross sectional view of the upper wafer presser plate.
Figure 5:
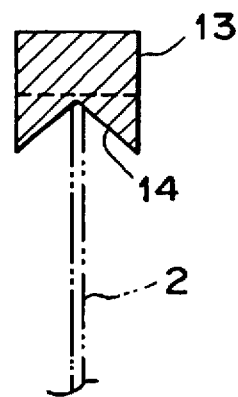
FIG. 5 is a cross sectional view of the upper wafer presser plate illustrated in FIG. 3 as cut and viewed along the direction shown by the arrows V—V.
Figure 6:
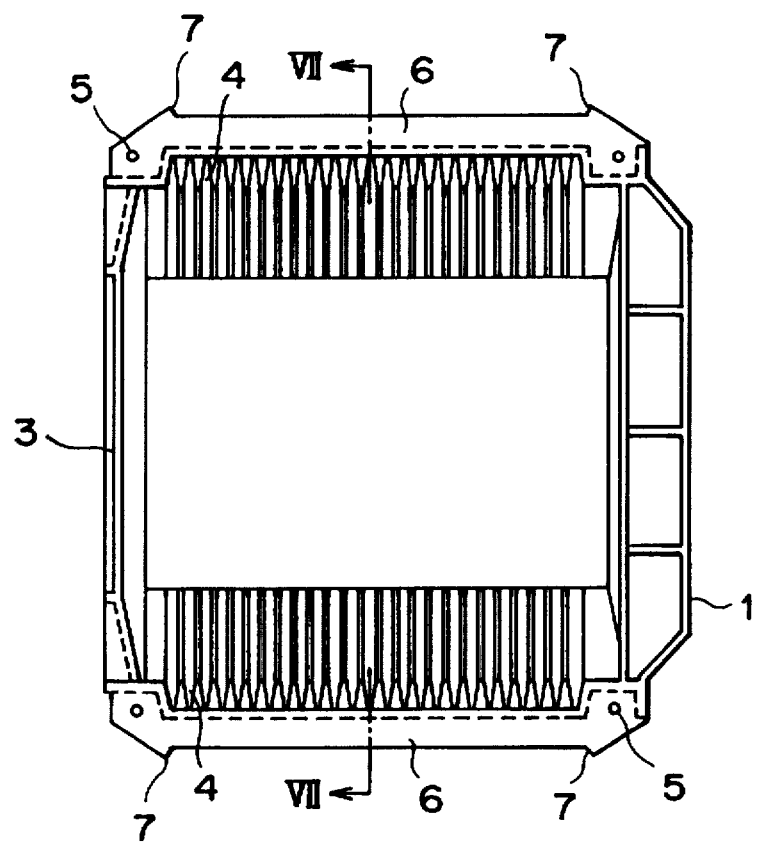
FIG. 6 is a plan view of the inventive wafer cassette of a wafer carrier.
Figure 7:
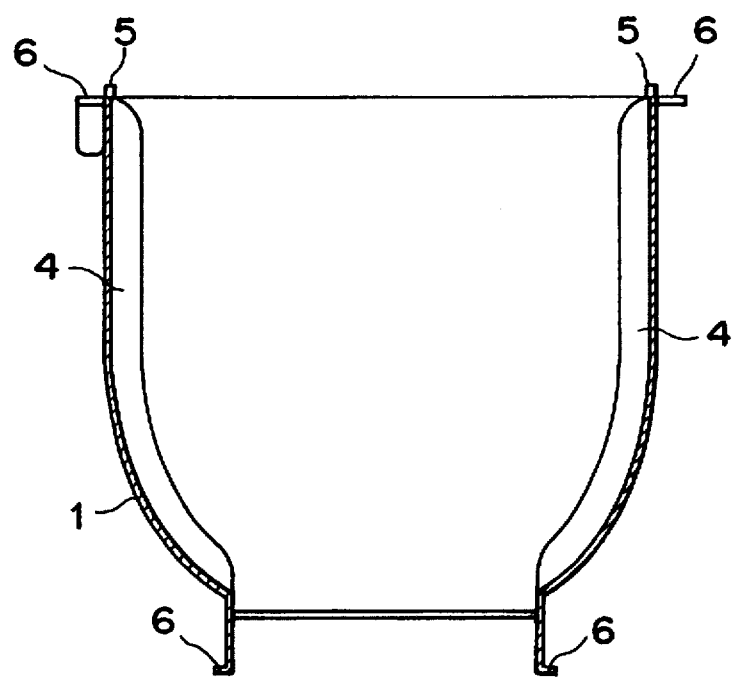
FIG. 7 is a cross sectional view of the inventive wafer cassette illustrated in FIG. 6 as cut and viewed along the direction shown by the arrows VII—VII.
Figure 8:
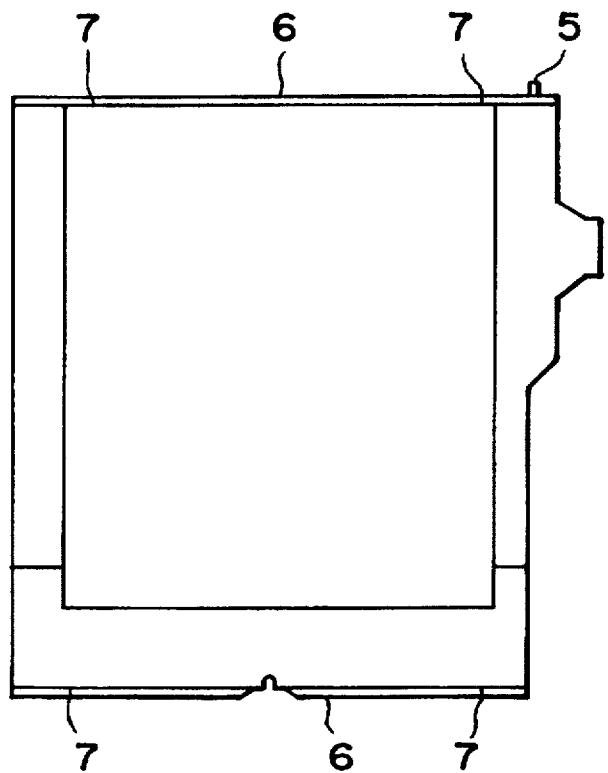
FIG. 8 is a side view of the inventive wafer cassette illustrated in FIG. 7.
Figure 11:
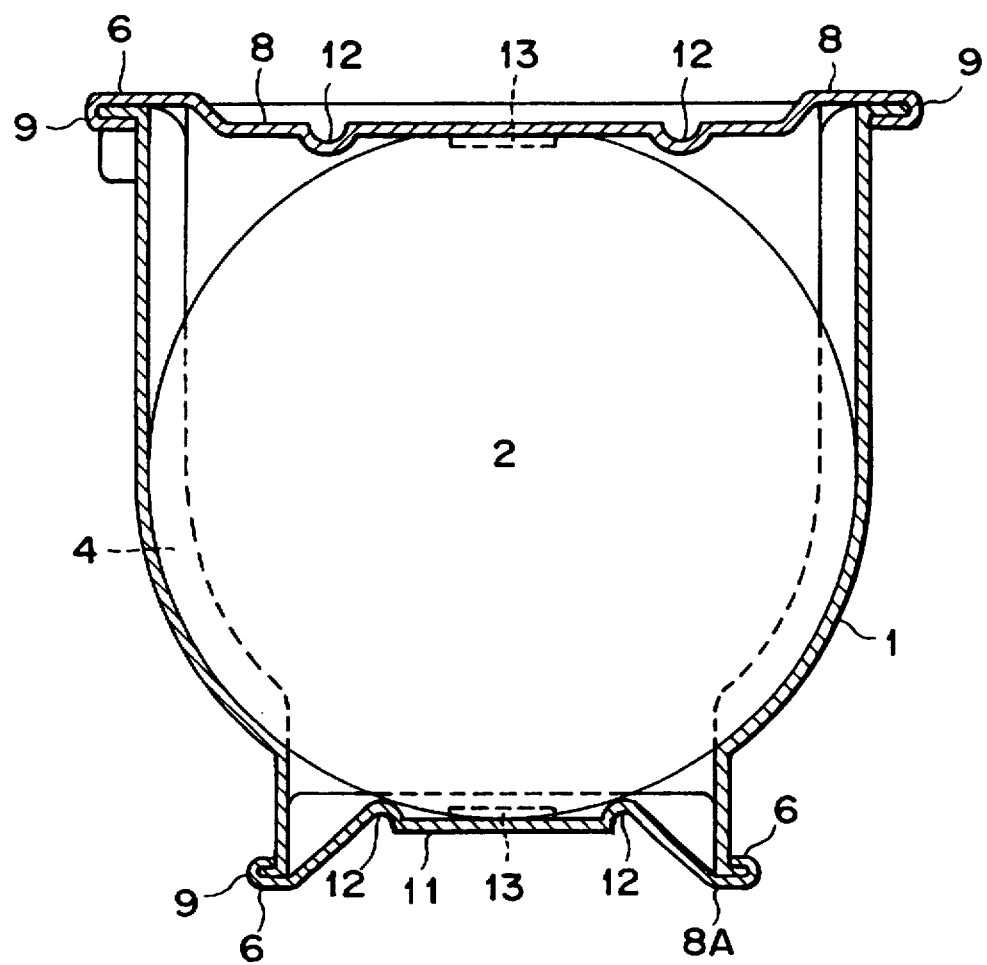
FIG. 11 is a vertical cross sectional side view of the inventive wafer cassette having the upper and lower wafer presser plates mounted thereon.
Figure 12:
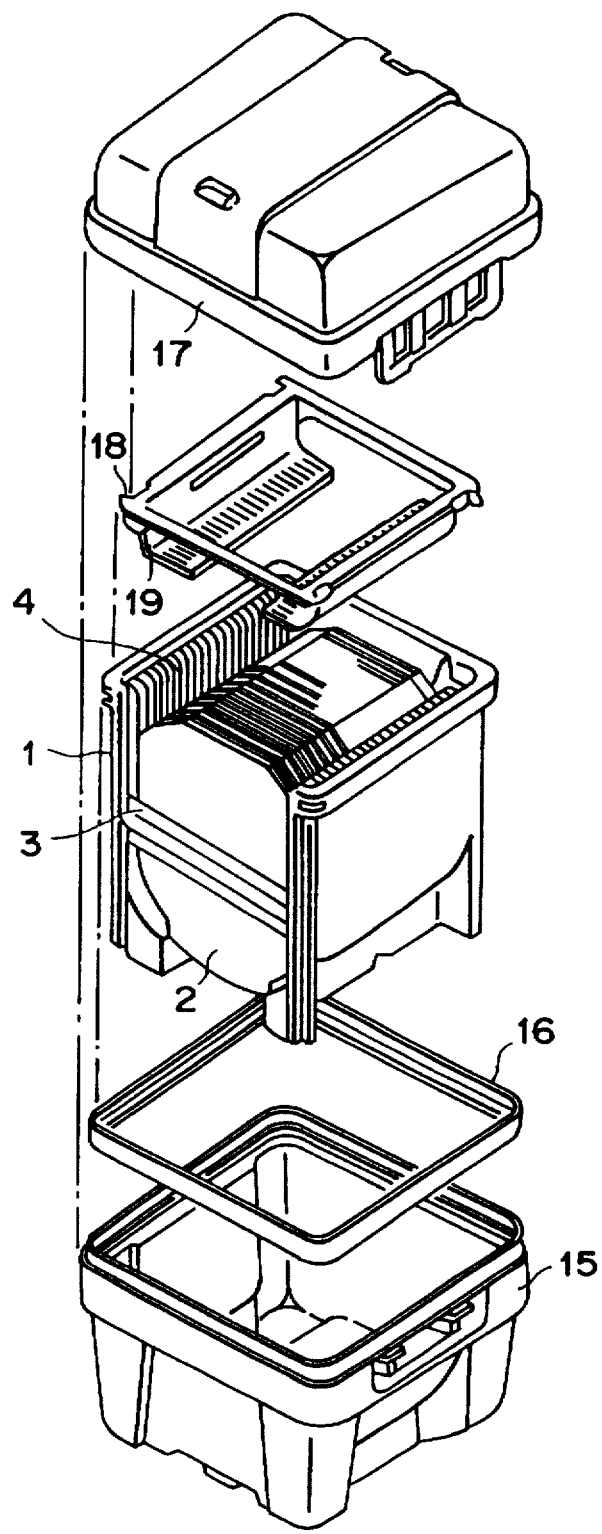
FIG. 12 is a perspective view of a wafer carrier with a conventional wafer cassette disassembled into parts.
Figure 13:
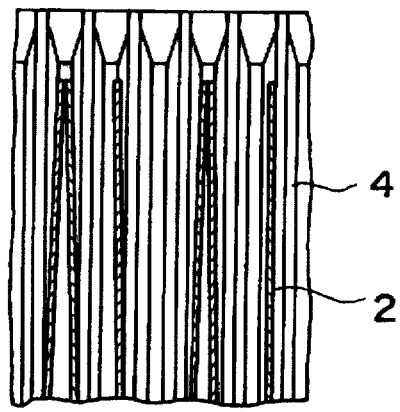
FIG. 13 is a partial cross sectional plan view of the conventional wafer cassette showing the condition of the silicon wafers held therein.
Figure 13:
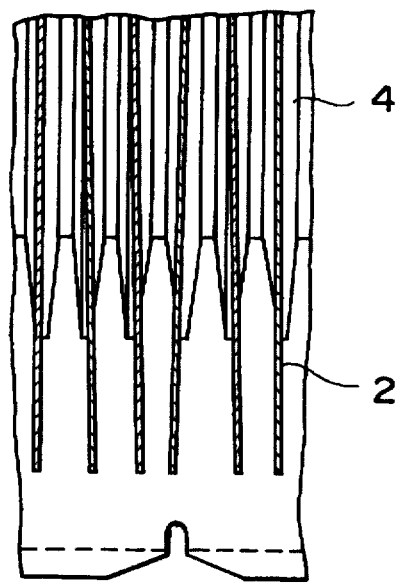
Figure 14:
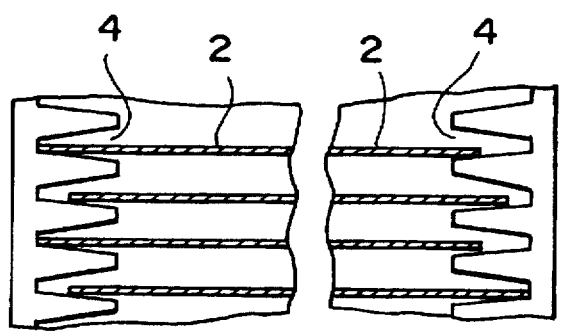
FIG. 14 is a partial cross sectional side view of the conventional wafer cassette showing the condition of the silicon wafers horizontally held therein.

The upper wafer presser plate 8 illustrated in FIGS. 1, 3 and 11 is molded from a transparent or colored polymeric material including thermoplastic resins such as polyolefins, e.g., polyethylene and polypropylene, ABS resins, polystyrene, PBT resins and the like and polyester-based, polyolefin-based and polystyrene-based thermoplastic elastomers. The width of the upper wafer presser plate 8 is approximately identical with the distance, i.e. the length in the right-to-left direction on FIG. 6, between a pair of positioning stoppers 7 on the upper surface of the cassette 1. The upper wafer presser plate 8 is bent back inwardly along each side periphery in the form of an elongated hook 9 which comes into engagement with the engagement ribs 6 on the upper surface of the cassette 1. The center area of the raised part between the hooks 9 is cut to form a plurality of openwork slits 10 arranged in the alignment direction of the silicon wafers 2 each as partitioned with the elastic plates 11 in the form of a leaf spring arranged in the same direction. The end parts 12 of each elastic plate 11 are each bent in a semicircular archwise form to bulge downwardly to face the upper periphery of one of the silicon wafers 2 so that the elastic plate 11 can exhibit appropriate elastic resilience against the wafer 2. Further, a downward protrusion 13 is formed at the center of each elastic plate 11 and the lower surface of the protrusion 13 is engraved along the center line thereof to form a groove 14 having a V-shaped cross section which receives the upper periphery of the silicon wafer 2 as is shown in FIG. 5.

Figure 4:
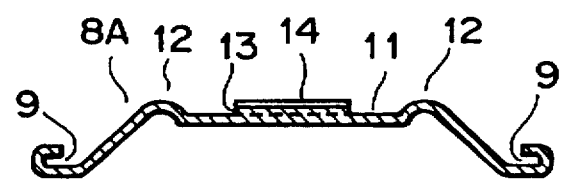
FIG. 4 is a vertical cross sectional view of the lower wafer presser plate.

Further, as is illustrated in FIGS. 2, 4 and 11, the lower wafer presser plate 8A is shaped from a plastic resin, which can be the same as that for the upper wafer presser 8, and has a similar cross sectional configuration to that of the upper presser plate 8. The width thereof, however, is approximately equal to the width between a plurality of the positioning stoppers 7 on the lower surface of the wafer cassette 1, i.e. the length in the right-to-left direction thereof. Each lateral end of this lower wafer press 8A is bent back inwardly to form an elongated hook which serves as an engagement part 9 coming into engagement with one of the engagement ribs 6 on the lower surface of the wafer cassette 1. The raised area between a pair of the engagement parts 9 is provided at the center with a plurality of openwork slits 10 in the direction of alignment of the silicon wafers 2 to be held thereon forming a plurality of lattice-like elongated elastic plates 11 to work as a leaf spring running in the same direction. The end portions 12 of each of the elastic plates 11 are curved in a semicircular archwise configuration bulging in the upper direction to face the silicon wafer 2 held on the lower wafer presser plate 8A so as to impart the elastic plates 11 with adequate elastic resilience. Further, each of the elastic plates 11 is integrally provided in the center with an upward protrusion 13 which is provided at the center thereof with an engraved groove 14 having a V-shaped cross section to receive the lower periphery of a silicon wafer 2 mounted thereon.

Figure 10:
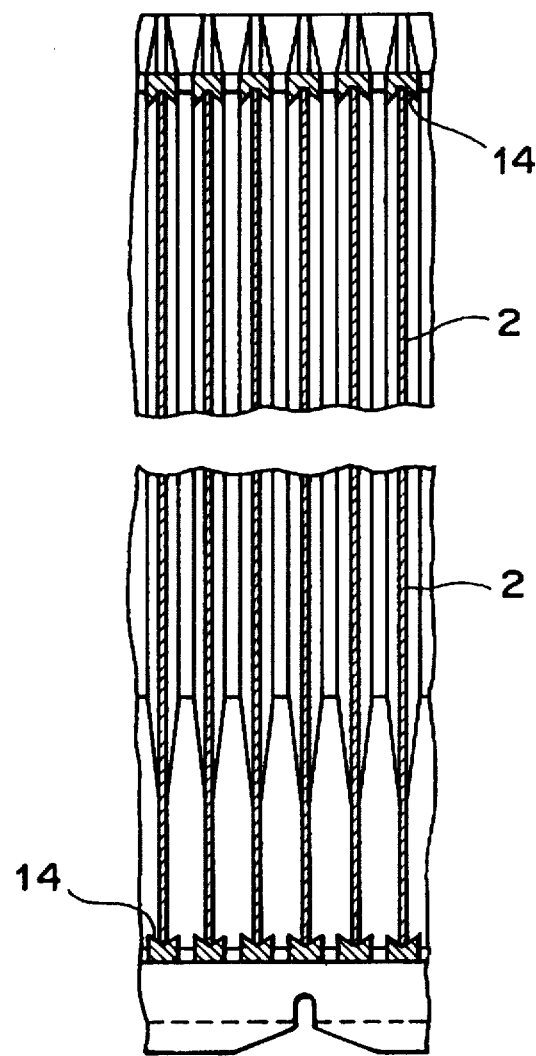
FIG. 10 is a partial cross sectional side view of the inventive wafer cassette holding silicon wafers.

When a large number of silicon wafers 2 are to be contained in a wafer carrier, as is shown in FIG. 11, the lower wafer presser plate 8A is first mounted on the lower surface of the wafer cassette 1 by the engagement of the engagement hooks 9 of the presser plate 8A with the respective engagement ribs 6 of the cassette 1 to close the lower open surface of the cassette 1. The lower wafer presser plate 8A is positioned between the positioning stoppers 7 of the engagement rib 6 in such a fashion that coincidence is accomplished between the center line of each of the alignment grooves 4 of the wafer cassette and the center line of one of the V-shaped grooves 14 of the respective protrusions 13 of the lower presser plate. In the next place, the silicon wafers 2 are inserted one by one into the wafer cassette 1 in such a fashion that, as is shown in FIG. 10, the lower periphery of each wafer 2 is in contact with the center line of the V-shaped groove 14 of the lower wafer presser plate 8A.

Thereafter, the upper wafer presser plate 8 is mounted on the upper open end of the wafer cassette 1 by the engagement of the engagement hooks 9 of the presser plate 8 with the respective engagement ribs 6 at the upper end of the cassette 1 so as to close the upper opening of the cassette 1 and the wafer cassette 1 is put into the container body 15 of the wafer carrier. Then, the frame-formed sealing member 16 such as a gasket or packing is mounted on and fixed to the upper open periphery of the container body 15. In this case, the upper wafer presser plate 8 is mounted in such a fashion as to be positioned between the positioning stoppers 7 of the engagement rib 6 so that coincidence is accomplished between the center line of each of the alignment grooves 4 of the wafer cassette and the center line of one of the V-shaped grooves 14 of the protrusions 13 of the upper presser plate. The silicon wafers 2 are each secured at an upper periphery orientation flat which is in contact with the center of the V-shaped groove 14 of the upper wafer presser plate 8 as is shown in FIGS. 5, 10, and 11. Finally, the covering 17 is mounted on the upper open periphery of the container body 15 with downward pressing in such a fashion that each of the fitting ribs 5 of the wafer cassette 1 is inserted into one of the fitting holes of the covering 17 to complete the packaging work of a plurality of silicon wafers 2 in an air-tightly sealed condition.

In the above described construction of the wafer carrier and the packaging procedure, the silicon wafers 2 are secured at the proper positions inside of the wafer cassette 1 directly by the upper and lower wafer presser plates 8, 8A each mounted on the upper and lower openings of the wafer cassette 1 so that the positioning of the silicon wafers 2 is absolutely not influenced by the relative positions of the wafer cassette 1, container body 15 and covering 17.

Figure 9:
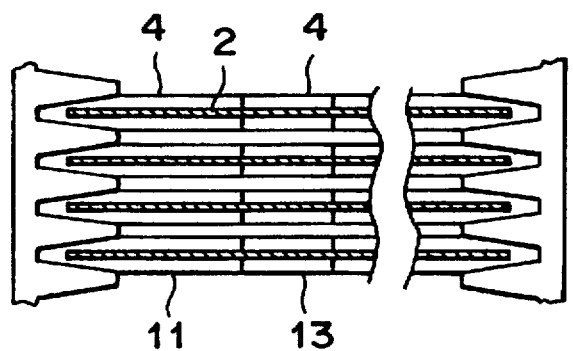
FIG. 9 is a partial cross sectional plan view of the inventive wafer cassette holding silicon wafers.

Accordingly, the silicon wafers can be secured at the correct positions and adequately protected even when the wafer cassette 1, container body 15 and covering 17 are in improper relative positions with a play. The silicon wafers can be protected from damages due to contacting of adjacent wafers 2 by tilting irrespective of the inclined disposition of the wafer carrier. Since each of the silicon wafers 2 is contacted at the upper and lower peripheries with the center lines of the V-shaped grooves 14 under an appropriate contacting pressure with resilience, the silicon wafer 2 can be held apart from the alignment groove 4 of the wafer cassette as is shown in FIG. 9 so that the problems due to contamination of the silicon wafers 2 by the deposition of abrasion dust particles or formation of scratches can be completely overcome. Even when the upper or lower periphery of the silicon wafer 2 is displaced from the center line of the V-shaped groove 14, the periphery can be returned to the proper position along the biased surface of the groove by the archwise bending of the elastic plate 11 under adequate resilience so as to always ensure proper positioning of the silicon wafers 2 without contacting with the alignment grooves 4. Further, any vibrations and mechanical shocks during transportation of the wafer carriers can be fully absorbed by the elastic resilience of the elastic plate 11 so that the silicon wafers 2 held on the wafer cassette 1 can be protected from mechanical damages. Since the upper and lower wafer presser plates 8, 8A are fixed each between a pair of the positioning stoppers 7, respectively, coincidence can easily be accomplished without skillfulness of the workers between the center lines of the alignment groove 4 of the wafer cassette and the V-shaped groove 14 of the protrusion 13 of the presser plates so that the efficiency of the packaging procedures can be greatly increased.

While, in the above described embodiment, the upper and lower wafer presser plates 8, 8A are positioned each between a pair of the respective positioning stoppers 7 so as to obtain coincidence between the center lines of the alignment groove 4 of the wafer cassette and the V-shaped groove 14 of the protrusion 13 of the presser plates, this is only one of alternative ways and other suitable means can be undertaken. For example, the engagement rib 6 is provided with a protrusion or a hole for fitting while the upper and lower presser plates 8, 8A are each provided with a hole for fitting or a protrusion and the protrusion and the fitting hole are brought into fitting so as to accomplish positioning of the center lines of the alignment groove 4 and the V-shaped groove of the protrusion 13.

What is claimed is:
1. A wafer carrier comprising:
   a cassette having
      an upper opening,
      a lower opening,
      a first side wall having, on an inner surface thereof, a first plurality of parallel alignment grooves,
      a second side wall, opposite to said first side wall, having, on an inner surface thereof, a second plurality of parallel alignment grooves;
   an upper presser plate, covering said upper opening of said cassette, and having
      a first upper engageable part attached to an upper portion of said first side wall of said cassette,
      a second upper engageable part, opposite to said first upper engageable part, and attached to an upper portion of said second side wall of said cassette, and
      a plurality of upper parallel elastic plates extending between said first upper engageable part and said second upper engageable part and each of said upper parallel elastic plates including a protrusion having a groove which forms a plate center line; and a lower presser plate, covering said lower opening of said cassette, and having
  a first lower engageable part attached to a lower portion of said first side wall of said cassette,
  a second lower engageable part, opposite to said first lower engageable part, and attached to a lower portion of said second side wall of said cassette, and
  a plurality of lower parallel elastic plates extending between said first lower engageable part and said second lower engageable part and each of said lower parallel elastic plates including a protrusion having a groove which forms a plate center line.

2. A wafer carrier as claimed in claim 1, further comprising:
  a first upper engagement rib protruding outwardly from said upper portion of said first side wall of said cassette;
  a second upper engagement rib protruding outwardly from said upper portion of said second side wall of said cassette;
  a first lower engagement rib protruding outwardly from said lower portion of said first side wall of said cassette;
  a second lower engagement rib protruding outwardly from said lower portion of said second side wall of said cassette;
  a first upper pair of positioning stoppers formed, with a space therebetween, on said first upper engagement rib;
  a second upper pair of positioning stoppers formed, with a space therebetween, on said second upper engagement rib;
  a first lower pair of positioning stoppers formed, with a space therebetween, on said first lower engagement rib;
  a second lower pair of positioning stoppers formed, with a space therebetween, on said second lower engagement rib.

3. A wafer carrier as claimed in claim 2, wherein:
  said first upper engageable part of said upper presser plate has a width substantially equal to said space between said first upper pair of positioning stoppers and is attached to said first upper engagement rib between said first upper pair of positioning stoppers;
  said second upper engageable part of said upper presser plate has a width substantially equal to said space between said second upper pair of positioning stoppers and is attached to said second upper engagement rib between said second upper pair of positioning stoppers;
  said first lower engageable part of said lower presser plate has a width substantially equal to said space between said first lower pair of positioning stoppers and is attached to said first lower engagement rib between said first lower pair of positioning stoppers; and
  said second lower engageable part of said lower presser plate has a width substantially equal to said second lower pair of positioning stoppers and is attached to said second lower engagement rib between said second lower pair of positioning stoppers;
  wherein said center lines of said upper presser plate, said center lines of said lower presser plate, and said alignment grooves of said cassette are in alignment.

4. A wafer carrier as claimed in claim 3, wherein:
  said first upper engageable part of said upper presser plate includes a first upper elongated hook hooked onto said first upper engagement rib of said cassette;
  said second upper engageable part of said upper presser plate includes a second upper elongated hook hooked onto said second upper engagement rib of said cassette;
  said first lower engageable part of said lower presser plate includes a first lower elongated hook hooked onto said first lower engagement rib of said cassette;
  said second lower engageable part of said lower presser plate includes a second lower elongated hook hooked onto said second lower engagement rib of said cassette.

5. A wafer carrier as claimed in claim 1, comprising:
  upper positioning means, on said cassette, for positioning said upper presser plate and said cassette such that said center lines of said upper presser plate are aligned with said alignment grooves of said cassette;
  lower positioning means, on said cassette, for positioning said lower presser plate and said cassette such that said center lines of said lower presser plate are aligned with said alignment grooves of said cassette;
  a container body into which said cassette is inserted; and
  a covering connected to said container body and said cassette.

6. A wafer carrier as claimed in claim 1, wherein said upper presser plate and said lower presser plate are flexible and elastic.

7. A wafer carrier as claimed in claim 6, wherein said upper presser plate and said lower presser plate are molded from an elastomer.

8. A wafer carrier as claimed in claim 1, wherein said protrusion of each of said upper parallel elastic plates and said protrusion of said each of said lower parallel elastic plates have a V-shaped cross section.

9. A wafer carrier as claimed in claim 1, further comprising:
  a wafer, wherein said protrusion of one of said plurality of upper parallel elastic plates and said protrusion of one of said plurality of lower parallel elastic plates hold said wafer therebetween such that said wafer is held between two of said first alignment grooves of said cassette and is held between two of said second alignment grooves of said cassette without contacting any of said first and second alignment grooves of said cassette.

10. A wafer carrier as claimed in claim 1, including holding means for holding a wafer between two of said first alignment grooves of said cassette and between two of said second alignment grooves of said cassette such that the wafer does not contact any of said first and second alignment grooves of said cassette.

11. A wafer carrier as claimed in claim 10, wherein said protrusion of each of said upper parallel elastic plates and said protrusion of said each of said lower parallel elastic plates have a V-shaped cross section.

12. A wafer carrier assembly as claimed in claim 10, further comprising:
  a wafer, wherein said protrusion of one of said plurality of upper parallel elastic plates and said protrusion of one of said plurality of lower parallel elastic plates are capable of holding said wafer therebetween such that said wafer is held between two of said first alignment grooves of said cassette and is held between two of said second alignment grooves of said cassette without contacting any of said first and second alignment grooves of said cassette.

13. A wafer carrier assembly comprising:
  a cassette having
    an upper opening,
    a lower opening, a first side wall having, on an inner surface thereof, a first plurality of parallel alignment grooves, a second side wall, opposite to said first side wall, having, on an inner surface thereof, a second plurality of parallel alignment grooves;

an upper presser plate, capable of covering said upper opening of said cassette, and having a first upper engageable part capable of attachment to an upper portion of said first side wall of said cassette, a second upper engageable part, opposite to said first upper engageable part, and capable of attachment to an upper portion of said second side wall of said cassette, and a plurality of upper parallel elastic plates extending between said first upper engageable part and said second upper engageable part and each of said upper parallel elastic plates including a protrusion having a groove which forms a plate center line; and a lower presser plate, capable of covering said lower opening of said cassette, and having a first lower engageable part capable of attachment to a lower portion of said first side wall of said cassette, a second lower engageable part, opposite to said first lower engageable part, and capable of attachment to a lower portion of said second side wall of said cassette, and a plurality of lower parallel elastic plates extending between said first lower engageable part and said second lower engageable part and each of said lower parallel elastic plates including a protrusion having a groove which forms a plate center line.

14. A wafer carrier assembly as claimed in claim 13, further comprising:

a first upper engagement rib protruding outwardly from said upper portion of said first side wall of said cassette;

a second upper engagement rib protruding outwardly from said upper portion of said second side wall of said cassette;

a first lower engagement rib protruding outwardly from said lower portion of said first side wall of said cassette;

a second lower engagement rib protruding outwardly from said lower portion of said second side wall of said cassette;

a first upper pair of positioning stoppers formed, with a space therebetween, on said first upper engagement rib;

a second upper pair of positioning stoppers formed, with a space therebetween, on said second upper engagement rib;

a first lower pair of positioning stoppers formed, with a space therebetween, on said first lower engagement rib;

a second lower pair of positioning stoppers formed, with a space therebetween, on said second lower engagement rib.

15. A wafer carrier as claimed in claim 14, wherein:

said first upper engageable part of said upper presser plate has a width substantially equal to said space between said first upper pair of positioning stoppers and is capable of attachment to said first upper engagement rib between said first upper pair of positioning stoppers;

said second upper engageable part of said upper presser plate has a width substantially equal to said space between said second upper pair of positioning stoppers and is capable of attachment to said second upper engagement rib between said second upper pair of positioning stoppers;

said first lower engageable part of said lower presser plate has a width substantially equal to said space between said first lower pair of positioning stoppers and is capable of attachment to said first lower engagement rib between said first lower pair of positioning stoppers; and said second lower engageable part of said lower presser plate has a width substantially equal to said second lower pair of positioning stoppers and is capable of attachment to said second lower engagement rib between said second lower pair of positioning stoppers;

wherein said center lines of said upper presser plate, said center lines of said lower presser plate, and said alignment grooves of said cassette are in alignment when said upper and lower presser plates are engaged with said cassette.

16. A wafer carrier assembly as claimed in claim 15, wherein:

said first upper engageable part of said upper presser plate includes a first upper elongated hook capable of being hooked onto said first upper engagement rib of said cassette;

said second upper engageable part of said upper presser plate includes a second upper elongated hook capable of being hooked onto said second upper engagement rib of said cassette;

said first lower engageable part of said lower presser plate includes a first lower elongated hook capable of being hooked onto said first lower engagement rib of said cassette;

said second lower engageable part of said lower presser plate includes a second lower elongated hook capable of being hooked onto said second lower engagement rib of said cassette.

17. A wafer carrier as claimed in claim 16, wherein said upper presser plate and said lower presser plate are molded from an elastomer.

18. A wafer carrier assembly as claimed in claim 13, comprising:

upper positioning means, on said cassette, for positioning said upper presser plate and said cassette such that said center lines of said upper presser plate are aligned with said alignment grooves of said cassette;

lower positioning means, on said cassette, for positioning said lower presser plate and said cassette such that said center lines of said lower presser plate are aligned with said alignment grooves of said cassette;

a container body into which said cassette is capable of being inserted; and a covering capable of being connected to said container body and said cassette.

19. A wafer carrier as claimed in claim 13, including holding means for holding a wafer between two of said first alignment grooves of said cassette and between two of said second alignment grooves of said cassette such that the wafer does not contact any of said first and second alignment grooves of said cassette.

20. A wafer carrier assembly as claimed in claim 13, wherein said upper presser plate and said lower presser plate are flexible and elastic.

* * * * *